US009116046B2

(12) United States Patent (10) Patent No.: US 9,116,046 B2
Fant et al. (45) Date of Patent: Aug. 25, 2015

(54) DEVICE AND METHOD FOR DETERMINING A DIRECTION FROM A SURFACE OF ONE OR MORE PHOTODETECTOR ELEMENTS OF AN INTEGRATED CIRCUIT TO A SOURCE PROVIDING ELECTROMAGNETIC WAVES AND METHOD FOR MANUFACTURING AN DEVICE

(71) Applicant: Infineon Technologies Austria AG, Villach (AT)

(72) Inventors: Andrea Fant, Nimis (IT); Rene Druml, St. Sefan/Gail (AT); Luca Sant, Tarcento (IT)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 39 days.

(21) Appl. No.: 13/835,799

(22) Filed: Mar. 15, 2013

(65) Prior Publication Data
US 2014/0268116 A1 Sep. 18, 2014

(51) Int. Cl.
*G01J 1/44* (2006.01)
*G01J 1/42* (2006.01)
*G01J 1/02* (2006.01)

(52) U.S. Cl.
CPC ............... *G01J 1/44* (2013.01); *G01J 1/0266* (2013.01); *G01J 1/4204* (2013.01); *G01J 1/4228* (2013.01)

(58) Field of Classification Search
CPC ........................................................ G01J 1/44
USPC ............................................ 356/139.03, 226
See application file for complete search history.

(56) References Cited

U.S. PATENT DOCUMENTS

| 5,264,910 | A | * | 11/1993 | Hill ............................ 356/141.2 |
|---|---|---|---|---|
| 5,428,215 | A | * | 6/1995 | Dubois et al. ............... 250/206.2 |
| 5,602,384 | A | * | 2/1997 | Nunogaki et al. .......... 250/203.4 |
| 5,719,670 | A | * | 2/1998 | Duboz et al. ............... 356/141.2 |
| 6,521,882 | B1 | * | 2/2003 | Sumiya et al. .............. 250/208.2 |
| 6,770,865 | B2 | * | 8/2004 | Wootton et al. ................ 250/226 |
| 6,875,974 | B2 | * | 4/2005 | Muesch et al. ............. 250/203.1 |
| 7,924,415 | B2 | * | 4/2011 | Leviton .................... 356/139.02 |
| 8,462,325 | B2 | * | 6/2013 | Van Bommel et al. ....... 356/121 |
| 2002/0053635 | A1 | * | 5/2002 | Schroter et al. ............. 250/203.1 |
| 2004/0104350 | A1 | * | 6/2004 | Tsuchiya et al. .......... 250/370.08 |
| 2007/0139765 | A1 | * | 6/2007 | Daniel et al. ................... 359/443 |
| 2007/0290284 | A1 | * | 12/2007 | Shaffer ......................... 257/432 |
| 2011/0242526 | A1 | * | 10/2011 | Van Bommel et al. ....... 356/121 |
| 2012/0312962 | A1 |   | 12/2012 | Hebert |

OTHER PUBLICATIONS

"QuickSenseTM Si11xx Optical Sensor IC Devices" p. 1-5; 2013; www.silabs.com/products/sensors/infraredsensors/Pages/default.aspx.
"Fully Integrated Proximity and Ambient Light Sensor with Infrared Emitter, I²C Interface, and Interrupt Function", Rev. 1.2, Oct. 10, 2012, Document No. 83476; p. 1-15; www.vishay.com.
Extract from Wikipedia "Quadrantendiode" dated Apr. 12, 2013; http://de.wikipedia.org/wiki/Quadrantendiode.

* cited by examiner

*Primary Examiner* — Roy M Punnoose

(57) ABSTRACT

In various embodiments a device is provided. The device includes an integrated circuit that includes one or more photodetector elements and a blocking structure monolithically integrated with the one or more photodetector elements. The one or more photodetector elements are arranged relative to the blocking structure such that electrical currents provided by the one or more photodetector elements in response to electromagnetic waves received by the one or more photodetector elements are indicative of a direction to a source providing the electromagnetic waves.

15 Claims, 6 Drawing Sheets

DEVICE AND METHOD FOR DETERMINING A DIRECTION FROM A SURFACE OF ONE OR MORE PHOTODETECTOR ELEMENTS OF AN INTEGRATED CIRCUIT TO A SOURCE PROVIDING ELECTROMAGNETIC WAVES AND METHOD FOR MANUFACTURING AN DEVICE

TECHNICAL FIELD

Various embodiments relate generally to a device, a method for determining a direction of electromagnetic energy incident upon a surface of a semiconductor device.

BACKGROUND

Infra-red (IR) proximity sensing systems, e.g. IR proximity detection requires proximity sensors that detect more than just a distance to an object (r coordinate in a polar coordinate system) to be able to reconstruct a 3-dimensional (3D) trajectory in space, e.g. for mobile applications e.g. (mobile) phones, tablet personal computers (pcs), laptops. Other applications are e.g. light source position detection or tracking e.g. solar trackers.

In another conventional arrangement, ultrasound sources and multiple microphones are used in addition to a photodiode to detect the trajectory of a light source. These solutions may have a large bill of materials and integration complexity.

In another conventional arrangement, cameras with 3D software reconstruction or time of flight systems are used to detect the trajectory. These solutions may be complex, power hungry and difficult to miniaturize.

SUMMARY

In various embodiments, a device is described herein. The device includes an integrated circuit. The integrated circuit may include one or more photodetector elements; and a blocking structure monolithically integrated with the one or more photodetector elements; wherein the one or more photodetector elements are arranged relative to the blocking structure such that electrical currents provided by the one or more photodetector elements in response to electromagnetic waves received by the one or more photodetector elements are indicative of a direction to a source providing the electromagnetic waves.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1A:
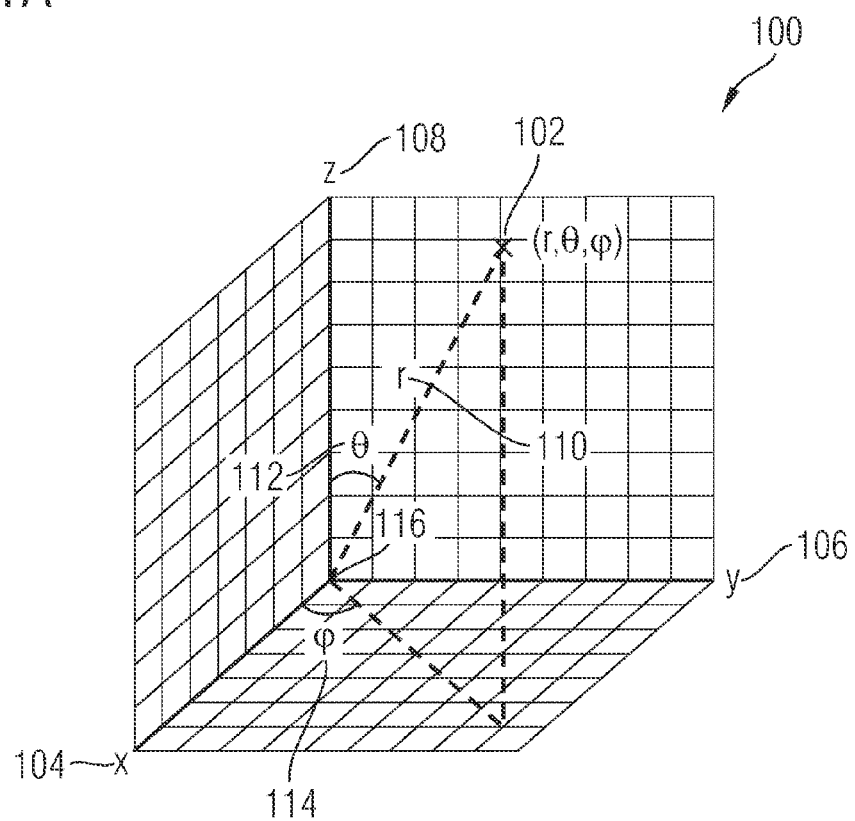
FIG. 1A to 1E show schematic drawings of a device according to various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

In various embodiments a device is provided with an integrated circuit. The integrated circuit integrates a needed functionality on a single chip instead of requiring multiple transmitters and/or receivers. This may reduce the required bill of materials, the system cost and complexity.

In various embodiments, one or more photodetector elements are provided. By way of example, a photodetector element may be a photodiode, an avalanche photodiode, a phototransistor or other photosensitive structure. In various embodiments, a photodetector element may absorb electromagnetic radiation and may be formed as a wired photodetector element, a surface mounted device (SMD) photodetector element or a chip-on-board photodetector element (Die), e.g. a photodetector array, a photosensitive wire. In various embodiments, a wired photodetector element may include a semiconductor chip a region of a semiconducting, wherein the semiconductor chip and/or region generate(s) an electrical current from absorbed electromagnetic radiation such as light. The semiconductor chip may be sealed by a cover. In other words: in various embodiments, an optoelectronic device that absorbs electromagnetic radiation may include one or more semiconductor chips that absorb electromagnetic radiation, e.g. one or more wired photodetector elements or SMD photodetector elements; or that is formed as a semiconductor (photodetector) chip that absorbs electromagnetic radiation, e.g. chip-on-board. In this description electromagnetic radiation may be light, ultraviolet radiation, x-rays and/or infrared radiation. In various embodiments, the photodetector elements may be part of an integrated circuit, in other words, may be monolithically integrated in the integrated circuit. In various embodiments, multiple photodetector elements may be formed beneath a common package. In various embodiments, the package may be at least partially formed as a sealing, an optical device, e.g. a lense, diffraction grating, aperture; or may include a dye, e.g. a fluorescent dye. The photodetector elements may be formed or placed on a substrate, e.g. a lead frame, metal foil, printed circuit board or flexible printed circuit board. The photodetector elements may be wire bonded with the substrate, e.g. using metal wires.

In various embodiments a device is provided that includes an integrated circuit. The integrated circuit includes one or more photodetector elements configured to detect electromagnetic energy, and at least one blocking structure monolithically integrated with the one or more photodetector elements and configured to block at least a portion of electromagnetic energy incident upon the integrated circuit.

The device further includes a detection module coupled to the one or more photodetector elements and configured to determine a direction of electromagnetic energy incident upon the integrated circuit relative to a source of the electromagnetic energy based upon an amount of electromagnetic energy detected by the one or more photodetector elements.

In various embodiments an integrated circuit is described herein, the integrated circuit may include: one or more photodetector elements; and a blocking structure monolithically integrated with the one or more photodetector elements; wherein the one or more photodetector elements are arranged relative to the blocking structure such that electrical currents provided by the one or more photodetector elements in response to electromagnetic waves received by the one or more photodetector elements are indicative of a direction to a source providing the electromagnetic waves.

In one embodiment of the device, the integrated circuit may include a plurality of photodetector elements.

In one embodiment of the device, the one or more photodetector elements comprise one or more photosensitive structures selected from the group consisting of a photodiode; an avalanche photodiode; and a phototransistor.

In one embodiment of the integrated circuit, the plurality of photodetector elements may include at least two photodetector elements. An integrated circuit with two photodetector elements may allow to determine the distance and one direction of a source of electromagnetic radiation to the device.

Figure 2A:
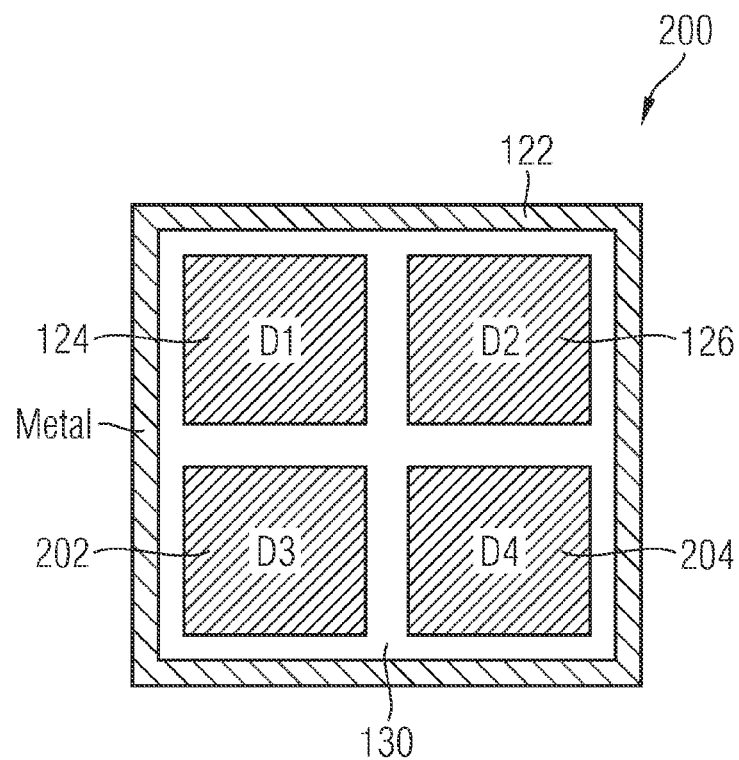
FIGS. 2A and 2B show schematic drawings of arrangements.

In one embodiment of the integrated circuit, the plurality of photodetector elements may include at least four photodetector elements (FIG. 2A). An integrated circuit with four photodetector elements may allow to determine the distance and the direction of a source of electromagnetic radiation to the device.

In one embodiment of the device, the integrated circuit may further include a plurality of photodetector cells, wherein each photodetector cell includes a plurality of photodetector elements and a plurality of blocking structures arranged adjacent the at least one photodetector cell.

In one embodiment of the device, the integrated circuit may further include a plurality of photodetector cells; wherein the blocking structure includes one or more blocking structures, wherein at least some of the blocking structure is disposed laterally between two respective photodetector cells.

In one embodiment, the device may further include a back-end-of-line structure disposed over the one or more photodetector elements; wherein the blocking structure includes at least a portion of the back-end-of-line structure. The blocking structure of the back-end-of-line structure including one or more blocking structures may be formed e.g. as an aperture or a collimator. In one embodiment, the back-end-of-line structure may include a casing or is formed as such.

In one embodiment, the blocking structure comprises at least one of an interdielectric layer and a metallization layer of the integrated circuit.

In one embodiment, a portion of the integrated circuit between a plurality of pillars comprises at least one interdielectric layer.

In one embodiment, the back-end-of-line structure may include a metallization structure used as blocking structure. In one embodiment the metallization structure may include or may be formed therefrom: iron, steal, aluminum, copper, silver, gold, palladium, magnesium, titanium, platinum, nickel, tin, zinc. In one embodiment the metallization structure may be formed as a mirror, aperture and/or collimator.

In one embodiment, the metallization structure may include an electrically conductive connecting structure and interdielectric material; wherein the blocking structure includes at least a portion of the electrically conductive connecting structure.

In one embodiment, the electrically conductive connecting structure may include at least one electrically conductive via or via-bar; wherein the blocking structure includes at least a portion of the at least one electrically conductive via or via-bar.

In one embodiment, at least a portion of interdielectric material may be formed in the radiation pathway of the one or more photodetector elements, e.g. between two adjacent blocking structures, wherein the adjacent blocking structures may form a frame for the photodetector elements.

In one embodiment, at least a portion of the interdielectric material may be one of optically transparent and translucent with respect to the electromagnetic waves.

In one embodiment, at least a portion of the interdielectric material and at least a portion of blocking structures may be formed with a CMOS-process, e.g wherein the interdielectric material and/or the blocking structure are/is formed of layers of a CMOS process.

In one embodiment, the at least one blocking structure comprises at least a portion of a plurality of metallization layers of a complementary metal oxide semiconductor (CMOS) process stack.

In one embodiment, the interdielectric material is formed at least partially transparent or translucent for electromagnetic radiation emitted from a source and/or reflected from the blocking structure.

In various embodiments, a translucent interdielectric material substantially transmits light, wherein the transmitted light may partially be scattered by the interdielectric structure, e.g. in one or more wavelength areas, e.g. infrared radiation or light. In various embodiments, a transparent interdielectric material substantially transmits light, e.g. in one or more wavelength areas, e.g. infrared radiation or light. In one embodiment, a translucent interdielectric material may include at least one rough interface in the path of the electromagnetic radiation and/or scattering particles. In one embodiment, the interdielectric material may include or may be formed therefrom: silicon, silicon oxide, e.g. glass, fused silica, silicon nitride, silicon carbid sapphire, polyolefine (e.g. polyethylen (PE) with high or low density, polypropylene (PP)), polyvinylchloride (PVC), polystyrene (PS), polyester, polycarbonate (PC), polyethyleneterephthalate (PET), polyethersulfone (PES), polyethylenenaphthalate (PEN), polymethylmethacrylate (PMMA), polyimide (PI), polyetherketone (PEEK), silicone, polysilazane, resin, epoxide.

In one embodiment, the one or more photodetector elements may include one or more infrared photodetector elements.

In one embodiment, the blocking structure may at least partially have a surface configured to reflect the electromagnetic waves, e.g. a reflective surface, e.g. high reflective or totally reflective.

In one embodiment, the blocking structure comprises at least one surface configured to reflect the electromagnetic waves.

In one embodiment of the integrated circuit, the integrated circuit may further include a blocking structure including an etched substrate trench that is filled with an electromagnetic wave reflecting material.

In one embodiment of the integrated circuit, the integrated circuit may further include a blocking structure including an etched substrate trench that is coated witch an electromagnetic wave reflective coating.

The integrated circuit may include an electromagnetic wave source configured to emit electromagnetic waves. In various embodiments, an electromagnetic radiation source may emit electromagnetic radiation which may also be denoted as electromagnetic waves. By way of example, the electromagnetic wave source may be configured to emit infrared light. The electromagnetic wave source may include at least one light emitting diode.

In various embodiments, the integrated circuit may further include encapsulation material at least partially encapsulating the one or more photodetector elements and the blocking structure. The encapsulation material may include or may be formed as a casing.

In one embodiment of the device, the integrated circuit and the detection module may be monolithically integrated with each other.

In one embodiment of the device, the device may further include a movable structure; wherein the detection module is further configured to control a movement of the movable structure dependent on the determined direction. A movement may be e.g. a rotation, tilt, shift increasing or decreasing the distance, e.g. a narrowing or opening of the movable structure. The movable structure may include a light tracking structure. Further, the light tracking structure may include a solar tracker.

In one embodiment, the detection module may be configured to determine an azimuthal angle and a polar angle from a surface of the one or more photodetector elements to the source providing the electromagnetic waves. In one embodiment, the source may be pulsed at a defined frequency to be distinguished from other existing sources in the same environment. In one embodiment the source will behave as a beacon, in other embodiments the source could be used as a pointing reference. In one embodiment the source may be reflecting the light coming from a second source.

In one embodiment of the device, the detection module may include an analog to digital converter to convert the electrical currents into digital current values. The detection module may include a direct current removal circuit to remove a direct current portion of the electrical currents provided by the one or more photodetector elements. A portion of the direct currents provided by the one or more photodetector elements may be removed, since the one or more photodetector elements may be biased and may be subject to leakage currents or, when a pulsed light source is used, because the direct current signal may be coming from existing ambient light and does not carry any information about the pulsed light source.

In various embodiments a method is provided, the method includes blocking at least a portion of the electromagnetic energy from a source via at least one blocking structure monolithically integrated with at least one photodetector element that is configured to detect electromagnetic energy. The method further includes detecting, via the one or more photodetector elements, an amount of electromagnetic energy from the source. The method further includes determining a direction of electromagnetic energy incident upon the integrated circuit relative to the source based upon the amount of electromagnetic energy detected by the one or more photodetector elements.

In various embodiments, a method for determining a direction from a surface of one or more photodetector elements of an integrated circuit to a source providing electromagnetic waves is provided. The integrated circuit may include one or more photodetector elements and a blocking structure monolithically integrated with the one or more photodetector elements. The method may include: detecting the electrical currents provided by the one or more photodetector elements in response to electromagnetic waves received by the one or more photodetector elements, wherein the electrical currents are indicative of the direction to a source providing the electromagnetic waves; and determining the direction to the source using the detected electrical currents.

The method may include the processing of the electrical currents provided by the one or more photodetector elements for the cases when the blocking structure is completely reflective or when the blocking structure is totally opaque. The method may include linear combinations of the measured current values to determine the distance r to the light source and its polar coordinates in space ($\theta$, $\phi$). The method may include calculation algorithms based on the result of the linear combination of the measured current or look-up algorithms with the same results used as inputs.

An example will be described, without limitation, that assumes a movement of the light source confined to the xz plane (y=0), and with a constant distance from the detector, i.e. if the detector is positioned at the origin of the polar axis reference frame, with its surface parallel to the xy plane, the source is moving at constant distance (r=constant) and $\phi$=0 or $\phi$=180°. In such case it is possible to calculate $$IX = (I_{IR2} + I_{IR4}) - (I_{IR1} + I_{IR3})$$

Here IX is the electrical current of the one or more photodetector elements as a function of the x-coordinate of the light source wherein $I_{IR2}$ is the electrical current of the 2nd photodetector element as example.

Both in the case of total reflection from the blocking structure, and in the case of total absorption from the blocking structure, the value of IX is, within boundaries for $\theta$, directly proportional to $\sin(\theta)$ where $\theta$ is the polar coordinate of the radiation source placed on the plane xz and moving at r=constant above the detector.

The same conclusion can be extended to the movement in the yz plane with constant distance (r=constant) and $\phi$=90° or $\phi$=270°; in this case the calculation will be $IY=(I_{IR1}+I_{IR2})-(I_{IR3}+I_{IR4})$ wherein IY is the electrical current of the one or more photodetector elements as a function of the y-coordinate of the light source. The value IY is, within boundaries for $\theta$, directly proportional to $\sin(\theta)$ where $\theta$ is the polar coordinate of the radiation source placed on the plane xz and moving at constant distance (r=constant) above the detector.

The trajectory of the light source in constant distance from the detector(r=constant) within the polar axis reference frame may be describe as a differential change of the electrical current I wherein I is a superposition of IX and IY.

The distance of the light source from the detector, that is the value of r, can be deducted from a standard method for proximity measurement. The method may use the sum of all currents to estimate the intensity of the incoming light, which may decrease with the distance of the source.

In various embodiments, a method for manufacturing an integrated circuit is provided. The method may include: forming one or more photodetector elements in the integrated circuit that are configured to detect electromagnetic energy; forming at least one blocking structure monolithically integrated with the one or more photodetector elements in the integrated circuit and coupling a detection module to the one or more photodetector, wherein the detection module is configured to determine a direction of electromagnetic energy incident upon the integrated circuit relative to a source of the electromagnetic energy based upon an amount of electromagnetic energy detected by the one or more photodetector elements.

In various embodiments, a method for manufacturing an integrated circuit is provided. The method may include: forming one or more photodetector elements; and forming a blocking structure monolithically integrated with the one or more photodetector elements such that the one or more photodetector elements is/are arranged relative to the blocking structure such that electrical currents provided by the one or more photodetector elements in response to electromagnetic waves received by the one or more photodetector elements are indicative of a direction to a source providing the electromagnetic waves.

FIG. 1A shows a schematic coordinate system. Depicted are the position of a radiation source 102 with distance r 110, azimuthal angle θ 112 and polar angle φ 114 with respect to a detector 116 in the origin of a Cartesian coordinate system with Cartesian coordinates x 104, y 106 and z 108.

Figure 1B:
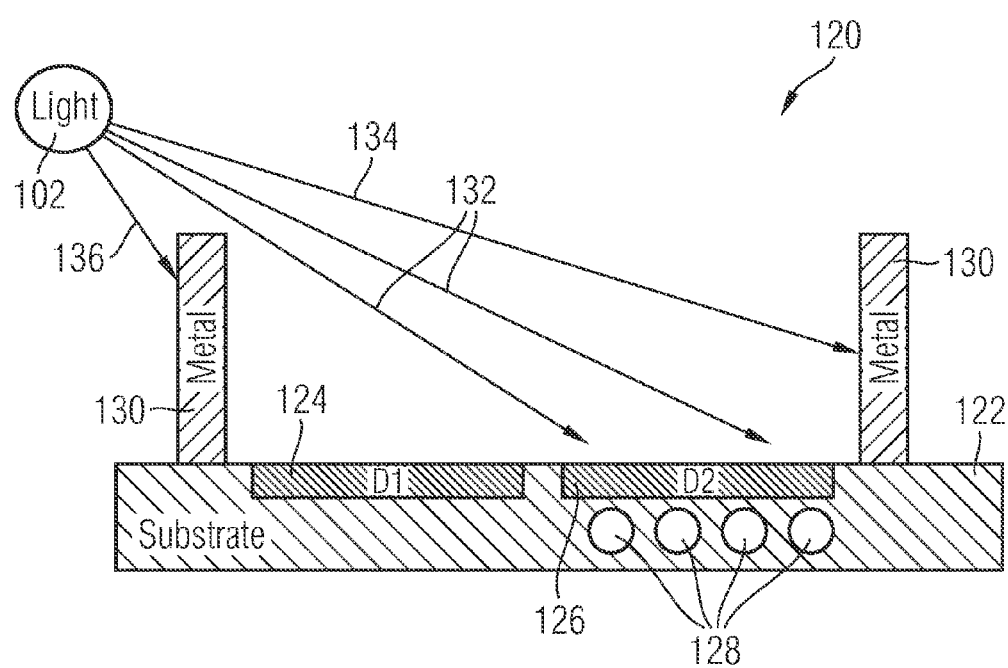
Figure 1C:
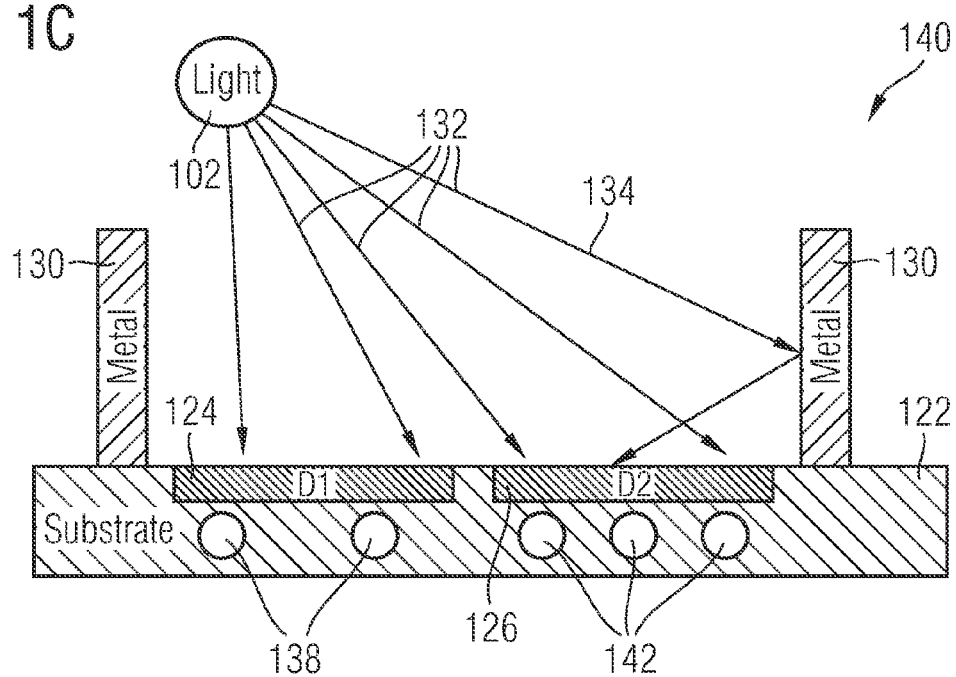
Figure 1D:
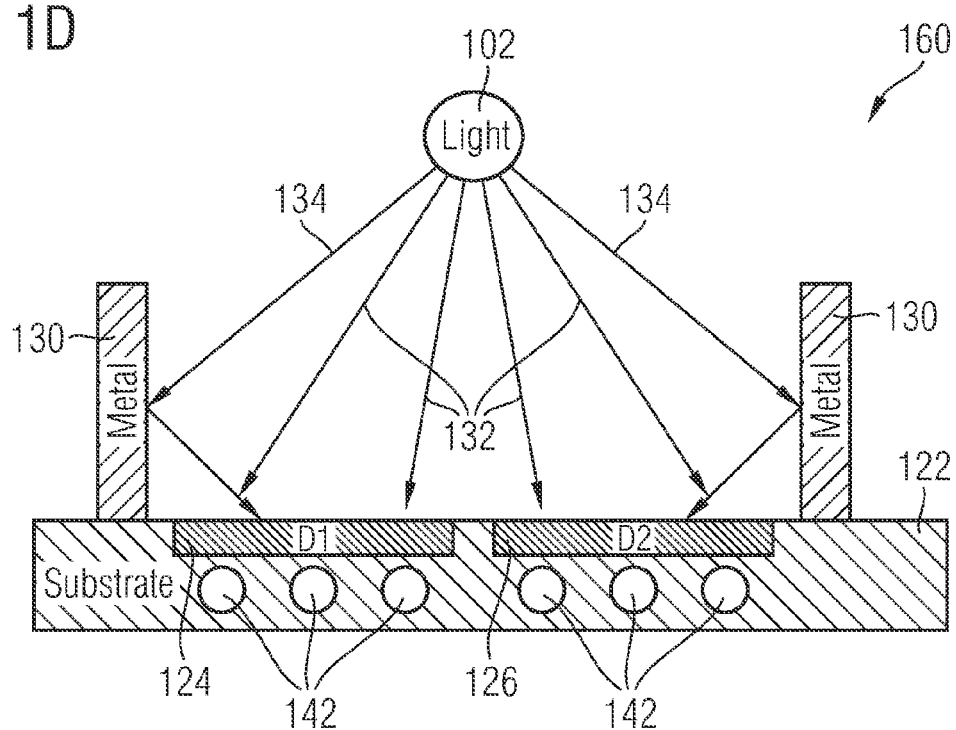

FIGS. 1B to 1D show a schematic cross section of the device according to various embodiments.

A schematic drawing of the effect is shown in the following pictures FIGS. 1B to 1D for a one-dimensional (1D) structure (examples of two-dimensional (2D) structures are depicted in FIG. 2 and FIG. 3). Depicted are an electromagnetic radiation source 102, wherein the radiation source emitting electromagnetic radiation 132, 134, 136, e.g. light, UV-radiation, IR-radiation, x-rays. The emitted electromagnetic radiation 132, 134, 136 falls at least partially on a device 116. The device 116 may include at least a first photodetector 124, a second photodetector 126 and a blocking structure 130.

The photodetector elements 124, 126 and the blocking structure 130 may be integrated on and/or in a common substrate 122, e.g. monolithically integrated, e.g. such that a part of the substrate 122 is formed as the blocking structure 130 and substrate 122 of the photodetector 124, 126. A photodetector may include an optically active surface such that an electric current is generated from impinging radiation, e.g. a CMOS photodetector. The substrate may include interconnects (not shown), e.g. conductor paths, conductor tracks and/or strip conductors, that are electrically connected to the photodetector elements 124, 126 and to an electric circuit. In this way the impinging electromagnetic radiation may generate an electric current depending on the incident angle of the electromagnetic radiation with respect to the surface of the photodetector elements 124, 126. In other words: the two photodetector elements 124, 126 may receive direct light 132 and reflected light 134 that is strongly dependent on the incoming angle 112, 114. The light 132, 134 generates an electrical current in the first photodetector 124 and/or the second photodetector 126. The relationship between the two currents contains the information about the incoming light angle, as shown in FIG. 1B to FIG. 1D.

The blocking structure 130 may be arranged and/or designed such that at least a part of the incident radiation 132 falls directly on at least one of the photodetector elements 124, 126. The blocking structure 130 may be designed such that at least a part of the incident radiation 134 is reflected in the direction of the photodetector elements 124, 126, e.g. including a material or surface topography such that electromagnetic radiation is at least partially reflected, e.g. totally reflected, e.g. including a mirror or a collimator. The blocking structure 130 may be arranged and/or designed such that at least a part of the incident radiation 136 is blocked from impinging on the photodetector elements 124, 126. Blocking of radiation by a blocking structure may also be denoted as shadowing. In various embodiments, the blocking structure 130 may be at least partially shaped similar to a collimator, aperture or a slit aperture. In other words: the blocking structure 130 is partially reflecting light 134 on a matched photodetector array and partially shadowing light 136 from a matched photodetector array. Depending on the height and/or shape of the blocking structure the size of the photodetector elements may be adapted. The device may be formed in a way that generates full shadow on one of the photodetector elements 124, 126 when the light falls in an angle of approximately 45° on the device. In one embodiment, the blocking structure 130 may be a part of the substrate 122, e.g. a filled trench. In one embodiment, the photodetector elements 124, 126 may be at least partially embedded in the substrate 122 with an optically active surface still exposed. In one embodiment the structure could be back-illuminated. In one embodiment, the photodetector elements may be built via diffusion in a silicon substrate, e.g. as photodiodes, phototransistors. This may form a monolithically integrated device. In one embodiment, the photodetector elements may be isolated photodetector elements attached to the substrate by an adhesive or mold. This may form yet another form of a monolithically integrated device. The photodetector elements may be electrically connected to a detection module (see FIG. 4) by means of at least one via (not shown). A detection module 410 (see FIG. 4) may be at least partially embedded in the substrate 122.

The light that falls on the photodetector elements 124, 126 generates an electric current 128 that provides a signal that correlates to the incidence angle of the incoming light, so that an information on azimuthal 112 and polar angle 114 of the light source 102 can be acquired. The device may be much smaller than typical "quadrant photodetectors". In this way, the device integrates a desired functionality on a single chip instead of requiring multiple transmitters and/or receivers. This may reduce the bill of materials, the system cost and/or complexity. The entire arrangement may be integrated in a single package reducing costs and integration complexity. Intelligence may be formed or built on the same substrate 122 to achieve complex system integration, e.g. for light-tracking applications, e.g. solar trackers, light source trackers. The final device may be small and easy enough to handle to be used for lighting control and simple user interfaces on home appliances. The method may be integrated in the standard CMOS process flow.

The radiation source may emit electromagnetic waves 132, 134, 136, e.g. light, that are partially blocked 136 and partially reflected 134 from the same part or different parts of the blocking structure depending on the incident angle of the radiation. At least a portion of the emitted light falls directly on at least one photodetector 126. At least one of the photodetector elements 124 may not be illuminated by direct light 132 or reflected light 134 and at least one photodetector may generate a first electric current 128 of the absorbed reflected light 134 and the direct light 132, as shown in FIG. 1B.

In another position of the radiation source 102 more photodetector elements 124, 126 than in FIG. 1B are illuminated. Therefore, more photodetector elements 124, 126 may generate an electrical current 138, 142. Depending on the position (r, θ, φ) of the radiation source regarding the photodetector elements 124, 126, a second electrical current 138 and a third electrical current 142 may be generated by the photodetector elements 124, 126—shown in FIG. 1C. In a special case, the photodetector elements 124, 126 may generate an equal electrical current 142 when the radiation source is centered above the photodetector elements 124, 126—shown in FIG. 1D.

Figure 1E:
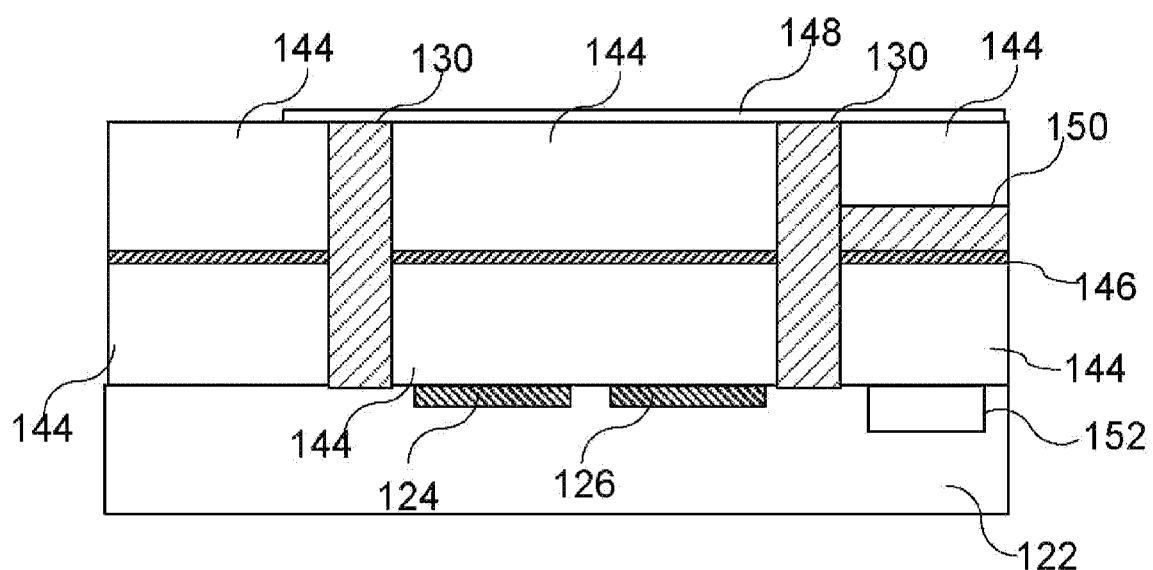
Figure 4:
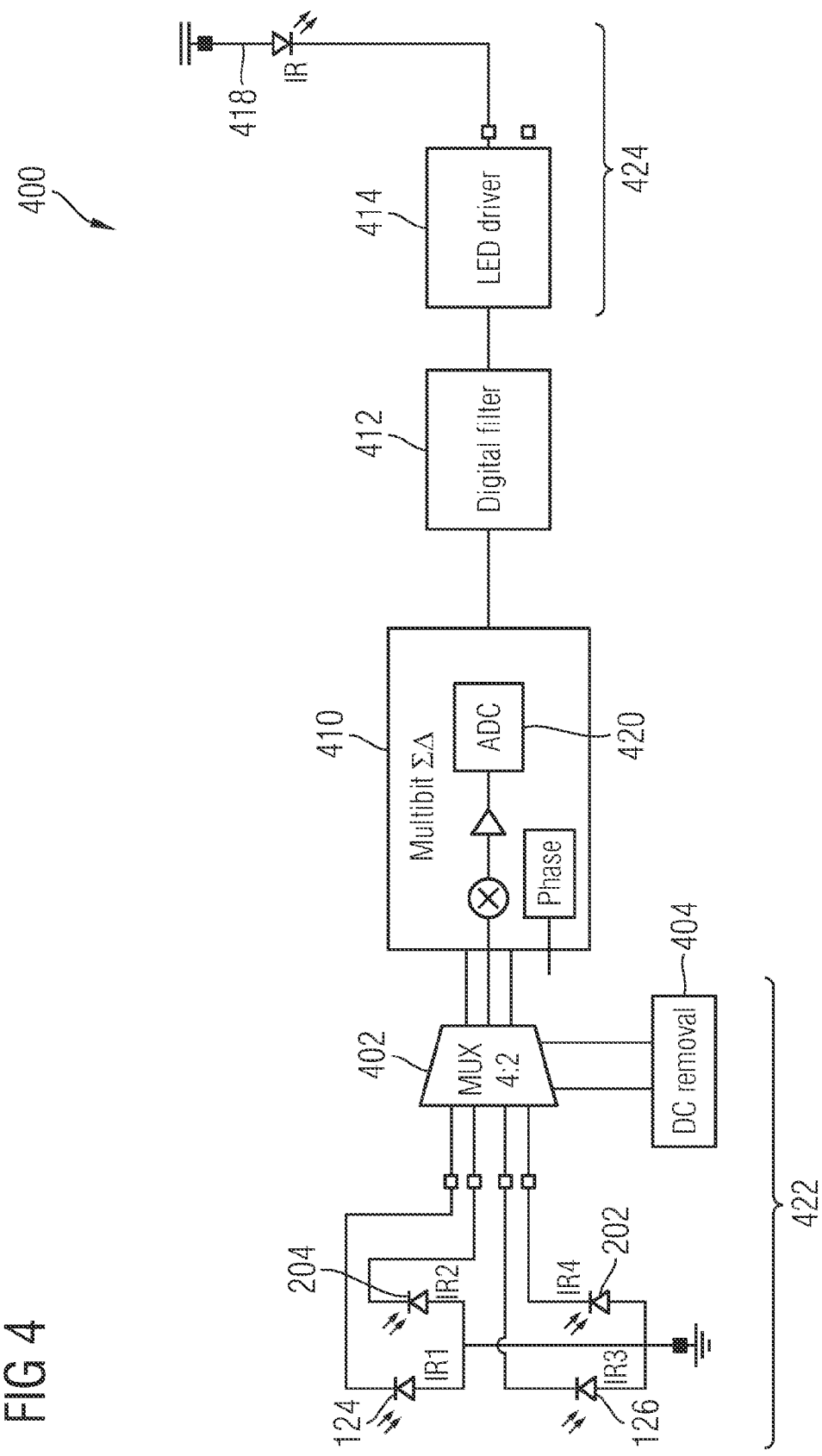
FIG. 4 shows a schematic block diagram of a device according to various embodiments.

FIGS. 1B to 1D show a schematic cross section of the device illustrating the path of the electromagnetic waves 132, 134, 136. FIG. 1E shows a schematic cross section depicting further components of the devices regarding the parts of the arrangement (FIG. 4). The device may be formed as one single monolithically integrated device as schematically shown in FIG. 1e. The layers shown in the cross-section are to be understood merely as examples of layers. Each layer may include one or more sublayers as desired. Furthermore, layers may be omitted in alternative embodiments.

As shown in FIG. 1E, the substrate 122 is provided as well as the first photodetector 124, the second photodetector 126, the blocking structure 130, and an interlayer dielectric 144, an intermediate structure 146, a surface structure 148, and a metallization layer including e.g. one or more lateral electrical connections 150, and one or more electronic circuits 152 provided in the substrate 122 and optionally connected to the first photodetector 124 and/or the second photodetector.

The interlayer dielectric 144 may include a dielectric material or may be formed thereof, e.g. a metall oxide, a metall nitride, a metall oxynitride, e.g. alumina, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, titanium nitride, tantalum nitride, tungsten, chromium, silicon carbide or mixtures and alloys thereof, or a low k dielectric, in other words a dielectric having a dielectric constant smaller than that of silicon oxide, i.e. a dielectric constant of smaller than 3.9. The interlayer dielectric 144 may be transparent or translucent.

The blocking structure 130 may have a material that reflects electromagnetic waves, e.g. a metal or a dielectric structure, e.g. a mirror, interference layers. The blocking structure 130 may be formed as a via or a via-bar and may connect several conductive layers of the device vertically or may be electrically isolated from another conductive layer. The blocking structure 130 may be formed as an electrical contact of one of the photodetector elements 124, 126. The blocking structure 130 may be formed of a metal, e.g. of Cu, Pt, Mg, Al, Ba, In, Ag, Ti, Co, W and Au, and compounds, combinations or alloys of these materials and/or their silicates and/or nitrides.

An optional intermediate structure 146 may have a diffusion bather, etch bather layer, adhesion promoting layer or the like or may be formed as such. In various embodiments, the intermediate structure 146 may include a high-k (having a dielectric constant of higher than 3.9) and/or low-k material (having a dielectric constant of lower than 3.9). In various embodiments, the intermediate structure 146 may have one, two, three, four or more layers, wherein the layers may have similar or different optical, electrical and chemical properties. In various embodiments, the intermediate structure 146 may include alumina, zinc oxide, zirconium oxide, titanium oxide, hafnium oxide, tantalum oxide lanthanum oxide, silicon oxide, silicon nitride, silicon oxynitride, indium tin oxide, indium zinc oxide, aluminum-doped zinc oxide, titanium nitride, tantalum nitride, tungsten, chromium, silicon carbide or mixtures and alloys thereof.

A surface structure 148 may have a diffusion bather, a thin film encapsulation, a conductive layer, e.g. an electrode or contact pad, or an adhesion promoting layer. In various embodiments, the surface structure 148 may include a high-k and/or low-k material. In various embodiments, the surface structure 148 may have one, two, three, four or more layers, wherein the layers may have similar or different optical, electrical and chemical properties, e.g. having different functions. In various embodiments, the surface structure 148 may include alumina, zinc oxide, zirconium oxide, titanium oxide, hafnium oxide, tantalum oxide lanthanum oxide, silicon oxide, silicon nitride, silicon oxynitride, indium tin oxide, indium zinc oxide, aluminum-doped zinc oxide, titanium nitride, tantalum nitride, tungsten, chromium, silicon carbide or mixtures and alloys thereof.

The lateral electrical connection 150 may be formed as horizontally connecting layer, connecting different parts of the arrangement laterally. It may be formed by an electrically conductive material, e.g. the same material as the blocking structure 130 and/or a metal or conductive polymer. In various embodiments, the lateral electrical connection 150 formed in the path of the electromagnetic waves 132, 134, 136 may be transparent or translucent. In various embodiments, the lateral electrical connection 150 may include a transparent conductive oxide (TCO), a metal oxide, such as zinc oxide, tin oxide, and the like or may be formed thereof. Further more, the lateral electrical connection 150 may include a binary metal oxide compound, such as ZnO, $SnO_2$, or $In_2O_3$, ternary metal-oxygen compounds, such as AlZnO, $Zn_2SnO_4$, and the like or mixtures of different transparent conductive oxides or formed therefrom. Furthermore, the TCOs do not necessarily need to correspond to a stoichiometric composition, and may be doped, e.g. p-doped or n-doped. Further more, the lateral electrical connection 150 may be formed as metal such that reflection or absorption of electromagnetic radiation is low, e.g. a thin film of Cu, Pt, Mg, Al, Ba, In, Ag, Co, W or Au, and compounds, combinations or alloys of these materials, e.g. a gold layer with thickness of about 10 nm to about 50 nm.

The electronic circuit 152 may be electrically connected to one of the photodetector elements 124, 126, directly or indirectly. In other words: The electronic circuit 152 may be part of the arrangement 400 (see FIG. 4), e.g. a multiplexer stage 402, a direct current remover 404, a detection module 410 and/or a digital filter 412, or may be part of a component of the arrangement, e.g. an analog digital converter 420 as part of a detection module 410 or a part of the analog digital converter 420. The electronic circuit 152 may include one or more pn-junction(s) or may be formed thereof, e.g. as a diode, diode for alternating current (DIAC), a transistor, a triode for alternating current (TRIAC), a thyristor, an integrated circuit, a charge coupling device, a transceiver, a receiver or the like. The electronic circuit 152 may be a digital electronics, e.g. a transistor transistor logic (TTL) or a complementary metall oxide semiconductor (CMOS).

The interlayer dielectric 144, intermediate structure 146, surface structure 148, lateral electrical connection 150 and/or electronic circuit 152 may be formed in the path of the electromagnetic waves 132, 134 that falls on the photodetector elements 124, 126 or may be formed next to the blocking structure 130. The interlayer dielectric 144, intermediate structure 146, surface structure 148, lateral electrical connection 150 and/or electronic circuit 152 may be stacked one above the other and/or may be formed next to each other.

Further more, the photodetector elements 124, 126 and/or the electronic circuit 152 may be connected to a redistribution layer (not shown), e.g. on the lower surface, on the substrate 122, e.g. as a bottom contact; or on the upper surface, on the interlayer dielectric 144 or as part of the surface structure 154 as a top contact.

Figure 2B:
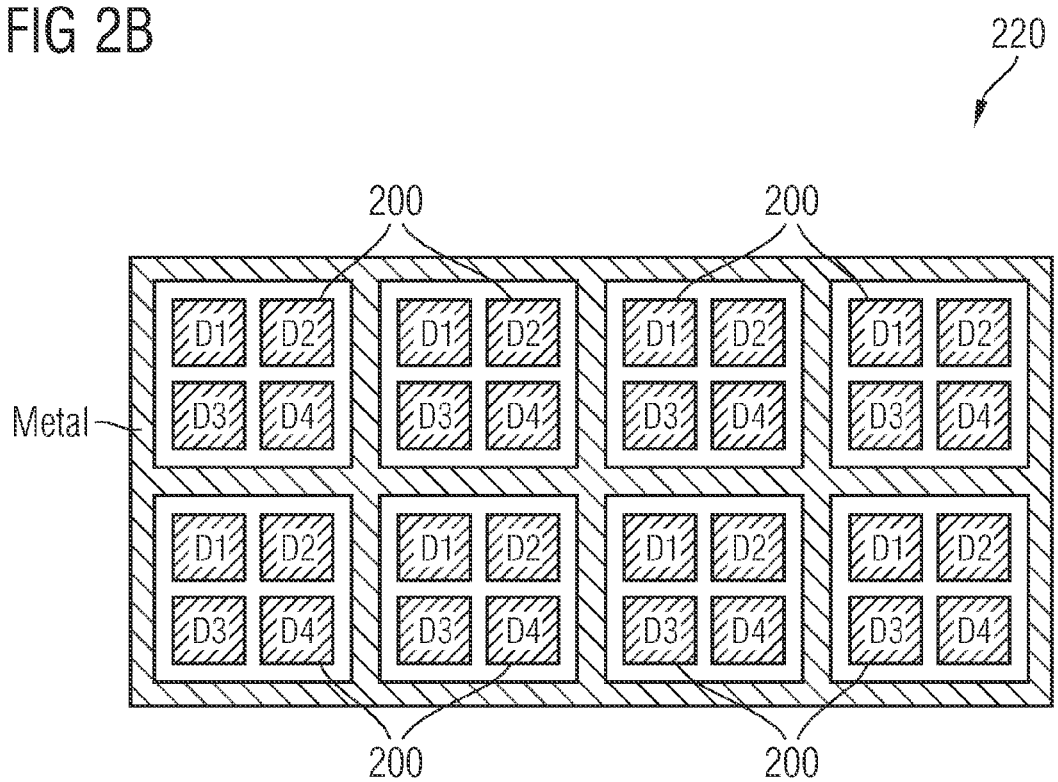

FIGS. 2A and 2B show schematic drawings of arrangements.

FIG. 2A shows a schematic drawing of a quadruple photodetector cell according to various embodiments.

Depicted are a first photodetector 124, a second photodetector 126, a third photodetector 202, a fourth photodetector 204, a blocking structure 130 and a part of the substrate 122. The substrate may be formed as a lead frame, a silicon wafer, a composite semiconductor, a metal foil or a printed circuit board, e.g. a flexible printed circuit board. Depicted multiple quadrant photodetector 200 according to FIG. 2A may be provided. In one embodiment, multiple cells may be formed next to each other (e.g. arranged in a two-dimensional array) on a common substrate to increase the signal amplitude, since the photodetector sizes should match the metal stack height of the used technology, as shown in FIG. 2B. Other shapes are possible for the elementary quadrant photodetector cell 200, e.g. linear, triangular, pentagonal, hexagonal and so on. Each photodetector cell 200 may include a matching number of photodetector elements. An array may include photodetector cells with different kinds of photodetector elements, e.g. photodetector elements which are sensitive to different wavelengths of electromagnetic radiation.

Figure 3A:
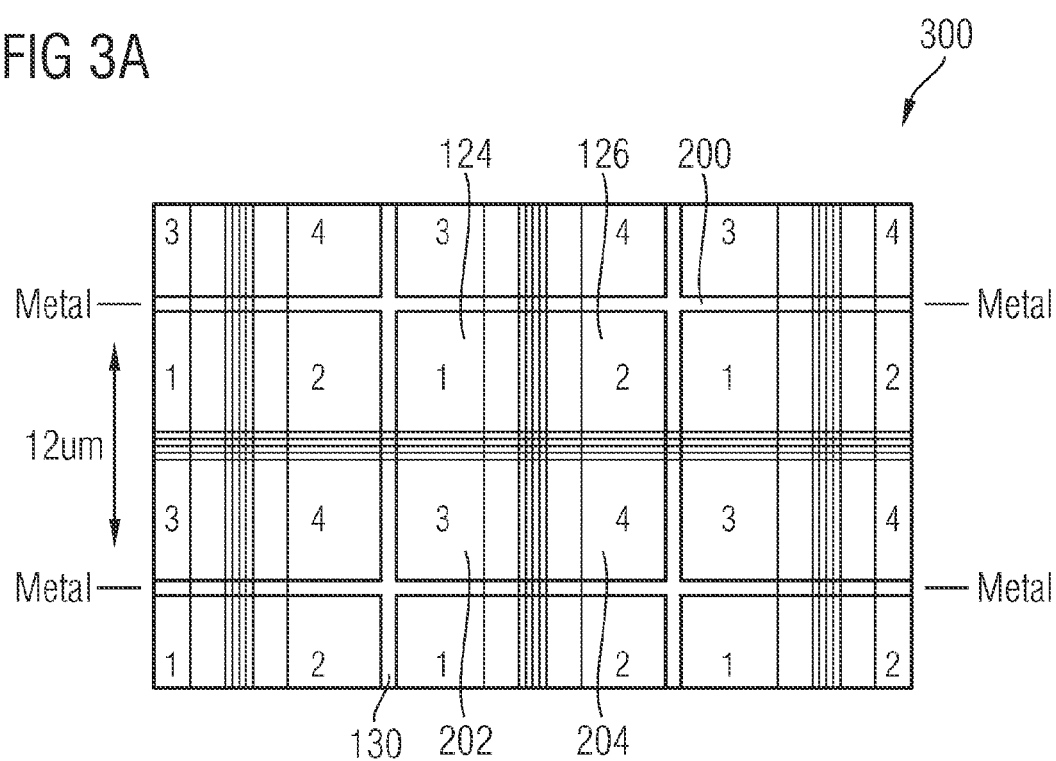
FIGS. 3A and 3B show embodiments of photodetector cell arrays.
Figure 3B:
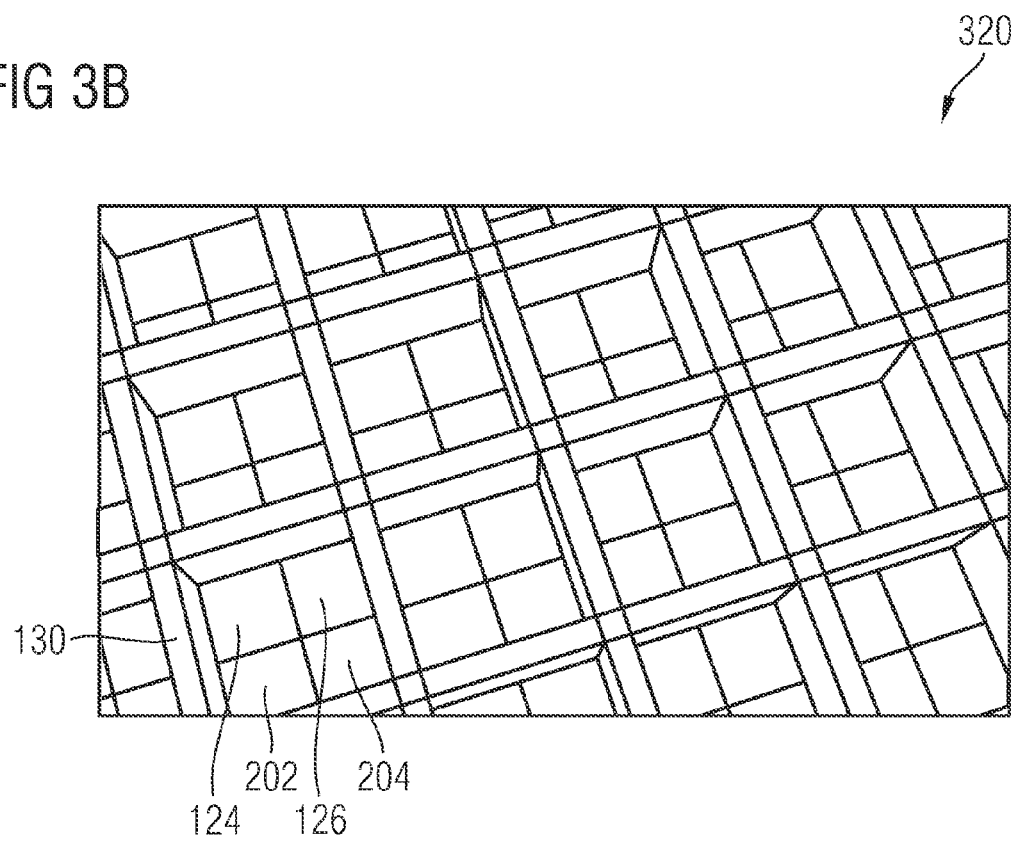

FIG. 3A and FIG. 3B show embodiments of a photodetector cell array.

FIG. 3A shows a plan view of an embodiment of a photodetector cell array with one or more photodetector elements 124, 126, 202, 204, separated by blocking structures 130, e.g. by metal blocking structures 130. A photodetector cell may have a width in the range from about 5 µm to about 100 µm, e.g. in the range from about 10 µm to about 50 µm. FIG. 3B shows a perspective view of the embodiment of FIG. 3A. In one embodiment, the photodetector cell array 200 may be used for light tracking applications, where an external light source should be pointed at or to detect its position with respect to the photodetector elements. In another embodiment the photodetector cell array may be used for direction sensitive proximity detection when connected to an appropriate signal processing device. In this case the direction and distance of the light reflecting from the object may be detected. The blocking structures 130 may in general have an arbitrary shape, e.g. a polygonal body, e.g. a cubical shape, alternatively a cylindrical shape or a honeycomb-like structure. The height of the blocking structures 130 may be adapted or matched to the impinging electromagnetic wave, e.g. light from the electromagnetic wave source, e.g. light source 102, e.g. to the position of the electromagnetic wave source, e.g. light source 102, and/or to the position and/or shape and/or size of the photodetector elements, so that the direction from the electromagnetic wave can be determined. By way of example, the height of the blocking structures 130 may be in the range from about 2 µm to about 50 µm, e.g. in the range from about 4 µm to about 10 µm by using the back-end of the line (BEOL) layers of a standard cmos technology (complementary metal-oxide-semiconductor technology). By adding or extending the BEOL stack, a height 50 µm may be possible.

By way of example, the blocking structure may include the use of standard metal stack layers in any cmos technology patterned so as to form the light blocking structure 130, e.g. collimation walls 130. A via construction may be added to fill the vertical gaps between metal layers also in form of via-bars, producing complete blocking of the light transmission through the bather. The metals of a standard 0.13 µm cmos technology are in the range of about 0.3 µm for the lowest routing meatal (M1) to 0.5 µm for the highest routing metal (e.g. M6) to 1 µm for the top Al routing metal layer. Each metal may be separated from its adjacent metal layers by layers of about 0.3 µm to 0.5 µm of silicon oxide and/or silicon nitride. By way of example, the structure may therefore have a height of about 5 µm in this technology. The intermetal space may be filled by a via structure generally used as plug to connect overlapping metals. The via may be extended in one direction as to form a blocking continuous metal bather that is impermeable to light.

In the preferred embodiment the final shape of the blocking structure may resemble the example shown in FIG. 3B, where each unit of four equal square photodetector elements is surrounded by four vertical structures formed from metal layers of a standard cmos metal stack. The unit is then repeated to cover a large enough area that ensures a sufficient signal amplitude for the subsequent processing.

FIG. 4 shows a schematic block diagram of a device according to various embodiments.

Depicted is a block diagram including a device according to an embodiment of FIGS. 1 to 4 with integrated circuit 422, e.g. a 4 channel detector system 422. The 4 channel detector system 422 may include electromagnetic radiation absorbing semiconductor device, e.g. four photodetector elements 124, 126, 202, 204 according to one embodiment of FIG. 2 or FIG. 3. In one embodiment, the input current of the photodetector elements 124, 126, 202, 204 may be biased by modulating the input current with the current of frequency $f_0$. The photodetector elements 124, 126, 202, 204 of the integrated circuit 422 may be electrically connected with their output with the input of a multiplexer stage 402 of the circuit 422. The output of the photodetector elements 124, 126, 202, 204 that are connected with the multiplexer stage 402 may be demodulated, e.g. coherently demodulated, and include a DC removal 404. The output of a multiplexer stage 402 may be connected to a detection module 410 of the device 400. The detection module 410 may include an analog-digital-converter (ADC) 420.

The detection module 410 may further include a digital filter 412, wherein the digital filter 412 is connected with the detection module 410.

The final information the device may produce to measure the incoming light angle is generated from the calculation of:

$$IX=(I_{IR2}+I_{IR4})-(I_{IR1}+I_{IR3})=(I_{IR2}-I_{IR3})-(I_{IR1}-I_{IR4})$$

$$IY=(I_{IR1}+I_{IR2})-(I_{IR3}+I_{IR4})=(I_{IR2}-I_{IR3})+(I_{IR1}-I_{IR4})$$

Here IX denotes the combination of currents that is related to the x-position 104, IY denotes the combination of currents that is related to the y-position 106 of the radiation source 102 (see FIG. 1a), $I_{IR1}$ denotes the current generated by the first photodetector 124, $I_{IR2}$ denotes the current generated by the second photodetector 126, $I_{IR3}$ denotes the current generated by the third photodetector 202 and $I_{IR4}$ denotes the current generated by the fourth photodetector 204. In one embodiment, the two values of IX and IY may be generated by measuring the factors $(I_{IR2}-I_{IR3})$ and $(I_{IR1}-I_{IR4})$ separately and then may be combined via a digital operation. The distance r 110 of the radiation source from the device (also denoted as proximity detection function) may be achieved by summing the currents of all photodetector elements 124, 126, 202, 204 ($I_{IR1}, I_{IR2}, I_{IR3}, I_{IR4}$), so that the position sensitivity effects are averaged out. In one embodiment, the multiplexer stage 402 may be shorting a combination of the photodetector elements 124, 126, 202, 204 to the ADC 420 input to measure differential currents. This embodiment may depend on the type of photodetector elements used. In one embodiment where one electrode of the photodetector elements 124, 126, 202, 206 is in common (n-well process) each current ($I_{IR1}, I_{IR2}, I_{IR3}, I_{IR4}$) may be measured separately after DC removal 404, and X, Y are generated as shown above. The two factors X, Y may be measured by shorting the photodetector elements 124, 126, 202, 204 in antiparallel on the ADC 420 input and thus DC removal 404 may be optional, e.g. for photodetector elements including p-plus in n-well, or with triple well processes also n-well in p-sub.

The device 400 may further include an illumination unit 424. In one embodiment, the illumination unit may include a light emitting diode (LED) 416. In one embodiment, the LED 416 may serve as radiation source 102 according to FIG. 1. In one embodiment, the LED may emit infrared radiation. In one embodiment, the LED 416 may be connected to a LED-driver unit 414.

In one embodiment the multiplexer stage 402 may be connected to one single photodetector 124, 126, 202, 204 for serial readout of the currents via the analog-digital-converter (ADC) 420.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A device, comprising:
    an integrated circuit that includes:
        one or more photodetector elements configured to detect electromagnetic energy; and
        at least one blocking structure monolithically integrated with the one or more photodetector elements and configured to block at least a portion of electromagnetic energy incident upon the integrated circuit; and
    a detection module coupled to the one or more photodetector elements and configured to determine a direction of electromagnetic energy incident upon the integrated circuit relative to a source of the electromagnetic energy based upon an amount of electromagnetic energy detected by the one or more photodetector elements;
    wherein the at least one blocking structure comprises at least one surface configured to reflect the electromagnetic waves.

2. The device of claim 1,
    wherein the one or more photodetector elements comprise one or more photosensitive structures selected from the group consisting of:
        a photodiode;
        an avalanche photodiode; and
        a phototransistor.

3. The device of claim 1,
    wherein the integrated circuit comprises a plurality of photodetector elements.

4. The device of claim 1, further comprising:
    at least one photodetector cell that comprises a plurality of photodetector elements; and
    a plurality of blocking structures arranged adjacent the at least one photodetector cell.

5. The device of claim 1:
    wherein the at least one blocking structure is a back-end-of-line structure.

6. The device of claim 1:
    wherein the at least one blocking structure comprises at least one of an interdielectric layer and a metallization layer of the integrated circuit.

7. The device of claim 1, further comprising:
    a further blocking structure;
    wherein a portion of the integrated circuit between the at least one blocking structure and the further blocking structure comprises at least one interdielectric layer.

8. The device of claim 6,
    wherein the material of the interdielectric layer comprises at least one of the following materials:
        an optically translucent metal oxide;
        an optically translucent metal nitride; and
        an optically translucent metal oxynitride.

9. The device of claim 1,
    wherein the at least one blocking structure comprises at least a portion of a plurality of metallization layers of a complementary metal oxide semiconductor (CMOS) process stack.

10. The device of claim 1,
    wherein the at least one blocking structure comprises an etched substrate trench that is filled with an electromagnetic wave reflecting material.

11. The device of claim 1,
    wherein the at least one blocking structure comprises an etched substrate trench that is coated with an electromagnetic wave reflective coating.

12. The device of claim 1,
    wherein the integrated circuit and the detection module are monolithically integrated with each other.

13. The device of claim 1,
    wherein the detection module is configured to determine an azimuthal angle and a polar angle from a surface of the one or more photodetector elements to the source of the electromagnetic waves.

14. A method, comprising:
    blocking at least a portion of the electromagnetic energy from a source via at least one blocking structure monolithically integrated with at least one photodetector element that is configured to detect electromagnetic energy;
    detecting, via the one or more photodetector elements, an amount of electromagnetic energy from the source; and
    determining a direction of electromagnetic energy incident upon the integrated circuit relative to the source based upon the amount of electromagnetic energy detected by the one or more photodetector elements;
    wherein the blocking structure comprises at least one surface configured to reflect the electromagnetic waves.

15. A method for manufacturing a device, the method comprising:
    forming an integrated circuit that includes:
        one or more photodetector elements in the integrated circuit that are configured to detect electromagnetic energy; and
        at least one blocking structure monolithically integrated with the one or more photodetector elements in the integrated circuit; and
    coupling a detection module to the one or more photodetector, wherein the detection module is configured to determine a direction of electromagnetic energy incident upon the integrated circuit relative to a source of the electromagnetic energy based upon an amount of electromagnetic energy detected by the one or more photodetector elements;
    wherein the blocking structure comprises at least one surface configured to reflect the electromagnetic waves.

* * * * *